United States Patent
Ishida et al.

(10) Patent No.: US 7,131,759 B2
(45) Date of Patent: Nov. 7, 2006

(54) VEHICULAR LAMP AND LIGHT SOURCE MODULE

(75) Inventors: Hiroyuki Ishida, Shizuoka-ken (JP);
Kiyoshi Sazuka, Shizuoka-ken (JP);
Masashi Tatsukawa, Shizuoka-ken (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 191 days.

(21) Appl. No.: 10/866,753

(22) Filed: Jun. 15, 2004

(65) Prior Publication Data

US 2004/0257827 A1    Dec. 23, 2004

(30) Foreign Application Priority Data

Jun. 20, 2003    (JP)    ............................. 2003-176943

(51) Int. Cl.
*F21V 21/00*    (2006.01)
*F21V 1/00*    (2006.01)

(52) U.S. Cl. .................. 362/545; 362/509; 362/84

(58) Field of Classification Search ............... 362/545, 362/487, 475, 507, 509, 510, 293, 84, 800, 362/540–544, 539, 255, 256, 257, 317; 340/468, 340/475; 313/543, 483
See application file for complete search history.

(56) References Cited

U.S. PATENT DOCUMENTS 6,345,903 B1 * 2/2002 Koike et al. ................. 362/249

FOREIGN PATENT DOCUMENTS

JP        06-089601 A    3/1994
JP        2003-031011 A    1/2003

* cited by examiner

*Primary Examiner*—Sandra O'Shea
*Assistant Examiner*—Bao Q. Truong
(74) *Attorney, Agent, or Firm*—Sughrue Mion, PLLC (57) ABSTRACT

A vehicular lamp used in an automobile, includes: a light source module for generating light; and an optical member for directing the light generated by the light source module forward. The light source module includes: a semiconductor light-emitting element or device for generating light; a fluorescent member for emitting light in accordance with the light generated by the semiconductor light-emitting element, the fluorescent member covering a surface of the semiconductor light-emitting element; and a light-blocking member, formed to be opposed to the semiconductor light-emitting element with the fluorescent member sandwiched therebetween and cover a side of the semiconductor light-emitting element and a part of the fluorescent member, for blocking a part of the light generated by the semiconductor light-emitting element and a part of the light emitted by the fluorescent member.

5 Claims, 11 Drawing Sheets

VEHICULAR LAMP AND LIGHT SOURCE MODULE

This patent application claims priority from a Japanese patent application No. 2003-176943 filed on Jun. 20, 2003, the contents of which are incorporated herein by reference.

BACKGROUND OF THE INVENTION

1. Field of the Invention

The present invention relates to a vehicular lamp and a light source module. More particularly, the present invention relates to a vehicular lamp and a light source module for use in a vehicle such as an automobile.

2. Description of the Related Art

A vehicular lamp such as a headlight of an automobile is required to form a light distribution pattern with high accuracy for safety reasons. This light distribution pattern is formed by an optical system using a reflector or lens as disclosed, for example, in Japanese Patent Application Publication (Laid-Open) No. 6-89601.

In optical design of the light distribution pattern of the vehicular lamp, it is necessary to consider a shape of a light source or the like, in some cases. Moreover, in a case of using a semiconductor light-emitting element or device in the vehicular lamp, the semiconductor light-emitting element generates light from a light source on its entire surface that has a predetermined width on its entire surface. Thus, in this case, the optical design may become complicated, resulting in difficulty informing an appropriate light distribution pattern.

SUMMARY OF THE INVENTION

Therefore, it is an object of the present invention to provide a vehicular lamp and a light source module, which are capable of overcoming the above drawbacks accompanying the conventional art. The above and other objects can be achieved by combinations described in the independent claims. The dependent claims define further advantageous and exemplary combinations of the present invention.

According to the first aspect of the present invention, a vehicular lamp for use in an automobile, comprises: a light source module operable to generate light; and an optical member operable to direct the light generated by the light source module forward, wherein the light source module includes: a semiconductor light-emitting element or device operable to generate light; a fluorescent member, covering a surface of the semiconductor light-emitting element, operable to emit light in accordance with the light generated by the semiconductor light-emitting element; and a light-blocking member, formed to be opposed to the semiconductor light-emitting element with the fluorescent member sandwiched therebetween and cover a side of the semiconductor light-emitting element and a part of the fluorescent member, operable to block a part of the light generated by the semiconductor light-emitting element and a part of the light emitted by the fluorescent member.

The optical member may form at least a part of a cut line that defines a boundary between a bright region and a dark region in a light distribution pattern of the vehicular lamp by projecting at least a part of a shape of an edge of the light-blocking member.

The light-blocking member may be formed to overlap the fluorescent member.

The light source module may include a plurality of semiconductor light-emitting elements, and the light-blocking member may be provided commonly to the plurality of semiconductor light-emitting elements in such a manner that the light-blocking member covers a side of each of the plurality of semiconductor light-emitting elements.

The light-blocking member may be formed to entirely cover two sides of the semiconductor light-emitting element, the two sides being adjacent to each other.

According to the second aspect of the present invention, a light source module for use in a vehicular lamp, comprises: a semiconductor light-emitting element or device operable to generate light; a fluorescent member operable to emit light in accordance with the light generated by the semiconductor light-emitting element, the fluorescent member covering a surface of the semiconductor light-emitting element; and a light-blocking member, formed to be opposed to the semiconductor light-emitting element with the fluorescent member sandwiched therebetween and to cover a side of the semiconductor member and a part of the fluorescent member, operable to block a part of the light generated by the semiconductor light-emitting element and a part of the light emitted by the fluorescent member.

The vehicular lamp to which the present invention may be applied includes headlamps such as a regular headlamp, fog lamp or cornering lamp for automobiles, motorcycles or trains. The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
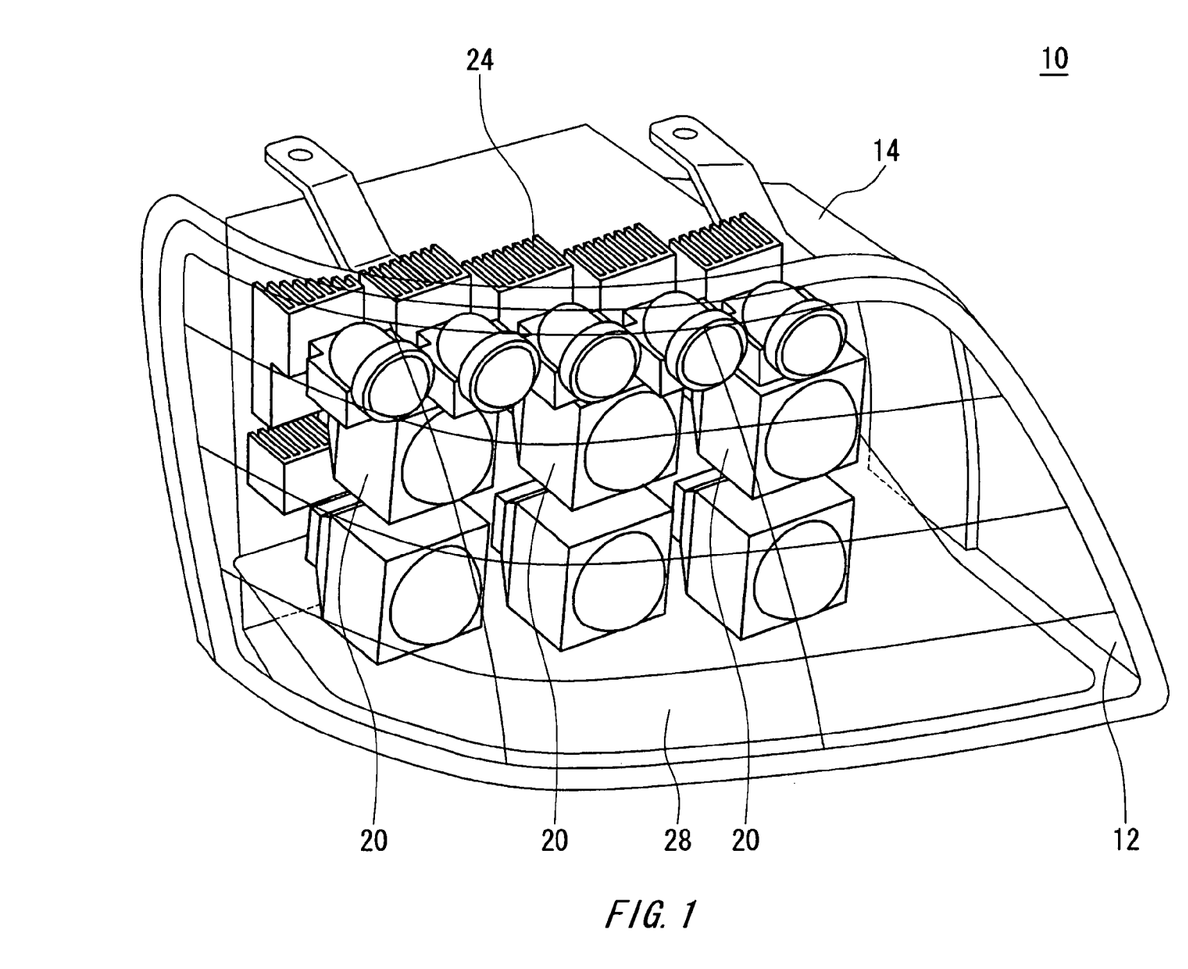
FIG. 1 is a perspective view of a vehicular lamp according to an embodiment of the present invention.
Figure 2:
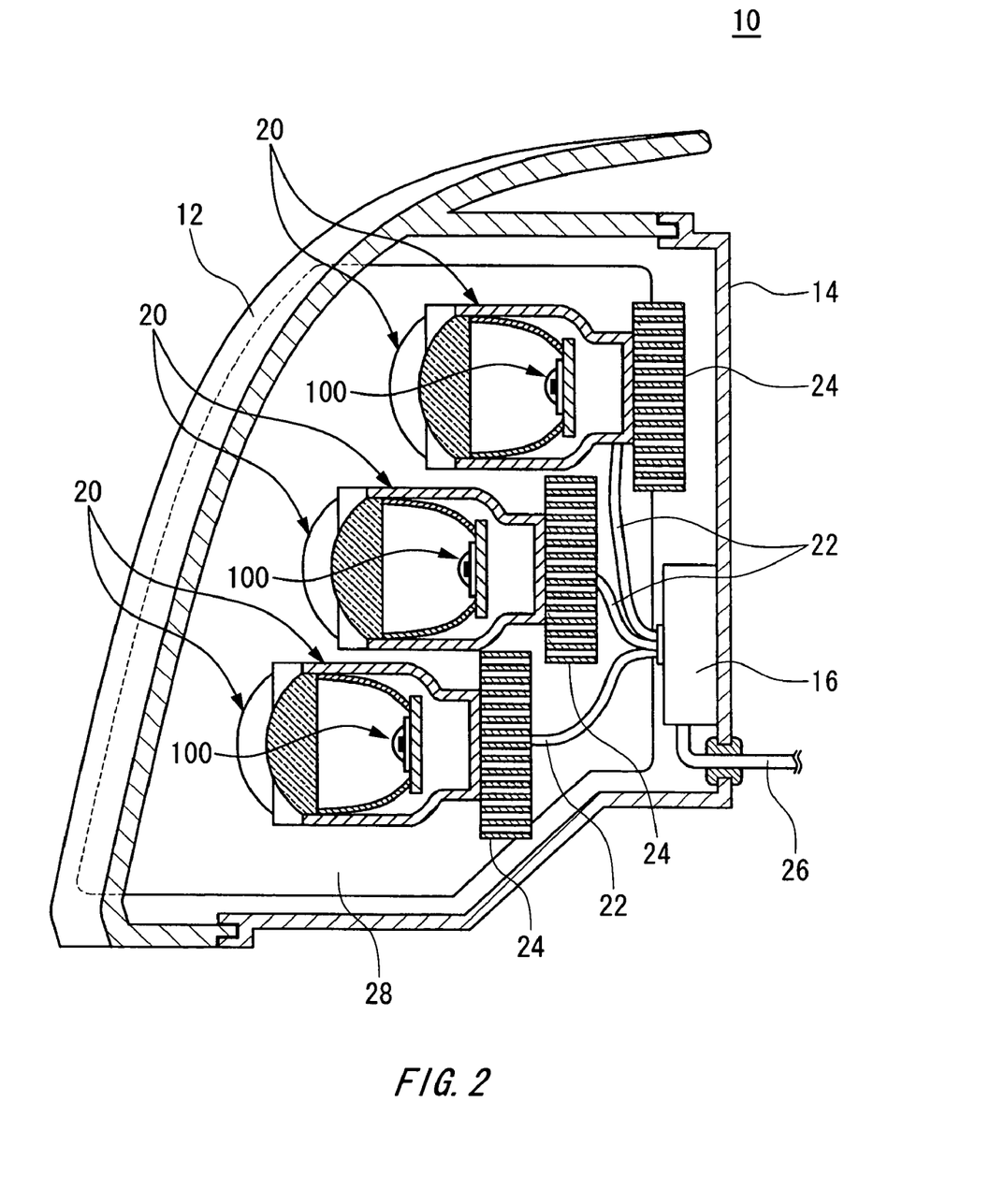
FIG. 2 is a horizontal cross-sectional view of the vehicular lamp shown in FIG. 1.

FIGS. 1 and 2 show an exemplary structure of a vehicular lamp 10 according to an embodiment of the present invention. FIG. 1 is a perspective view of the vehicular lamp 10, and FIG. 2 is a cross-sectional view thereof taken along a horizontal plane crossing respective light source units 20 in the middle stage. The vehicular lamp 10 is an automotive headlight (head lamp) used in an automobile such as a vehicle, for example, and emits light forward of the automobile. The vehicular lamp 10 includes a plurality of light source units 20, a cover 12, a lamp body 14, a circuit unit 16, a plurality of heat-radiation members 24, an extension reflector 28, a cable 22 and a cable 26.

Each of the light source units 20 includes a light-source module 100, and emits light having a predetermined light distribution pattern forward of the automobile in accordance with light generated by the light source module 100. The light source unit 20 is supported by a lamp body 14, for example, so as to be inclined by an aiming mechanism for adjusting a direction of an optical axis of the light source unit 20. The light source unit 20 may be supported by the lamp body 14 in such a manner that its optical axis is at a downward angle of about 0.3° to about 0.6° with the horizontal plane when the vehicular lamp 10 is mounted on the body of the automobile.

The light source units 20 may have the same or similar light distribution characteristics or different light distribution characteristics. In an alternative example, one light source unit 20 may include a plurality of light source modules 100. In the example shown in FIG. 1, the light source module 100 is an LED module. The light source unit 20 may include a semiconductor laser in place of the light source module 100, for example.

The cover 12 and the lamp body 14 form a lamp room for accommodating a plurality of light source units 20. The cover 12 and the lamp body 14 may air-tightly seal the light source unit 20 and protect it from water. The cover 12 is formed to be transparent from material that can transmit light generated by the light source module 100, for example, and is provided on a front face of the automobile so as to cover the light source units 20 from the front. The lamp body 14 is provided to be opposed to the cover 12 with the light source units 20 interposed therebetween so as to cover the light source units 20 from behind. The lamp body 14 may be formed integrally with the body of the automobile.

The circuit unit 16 is a module in which a lighting circuit for lighting the light source module 100 and the like are formed therein. The circuit unit 16 is electrically connected to the light source unit 20 via the cable 22. The circuit unit 16 is also connected to the outside of the vehicular lamp 10 electrically via the cable 26.

Each of the heat-radiation members 24 is formed from material having higher thermal conductivity than air, such as metal. The heat-radiation member 24 is provided to be in contact with at least a part of the light source unit 20 and serves as a heat sink. Moreover, the heat-radiation member 24 can be moved in accordance with the movement of the light source unit 20 within a range corresponding to the range of the movement of the light source unit 20 with respect to a supporting point of the aiming mechanism, for example, and is arranged away from the lamp body 14 by a sufficient distance for the adjustment of the optical axis of the light source unit 20. The respective heat-radiation members 24 may be formed integrally from the same metal material. In this case, heat can be radiated from the whole of the heat-radiation members 24 efficiently.

The extension reflector 28 is formed by a thin metal plate, for example, to extend from a position under the light source units 12 to the cover 12. The extension reflector 28 serves as a reflector for reflecting light from the respective light source units 20. Moreover, the extension reflector 28 is formed to cover at least a part of the inner face of the lamp body 14, thereby hiding the shape of the inner face of the lamp body 14 so as to improve the appearance of the vehicular lamp 10.

At least a part of the extension reflector 28 is in contact with the light source units 20 and/or the heat-radiation members 24. In this case, the extension reflector 28 conducts heat generated by the light source module 100 to the cover 12. In this manner, the extension reflector 28 cools the light source module 100. In addition, a part of the extension reflector 28 is secured to the cover 12 or lamp body 14. The extension reflector 28 may be formed the light source units 20 from above and below the light source units 20 and from the side thereof.

According to this example, the size of the light source unit 20 can be reduced by using the light source module 100 as a light source. Moreover, the use of the light source module 100 improves the freedom of an arrangement of the light source unit 20, for example, and therefore the vehicular lamp 10 having excellent design can be provided.

Figure 3:
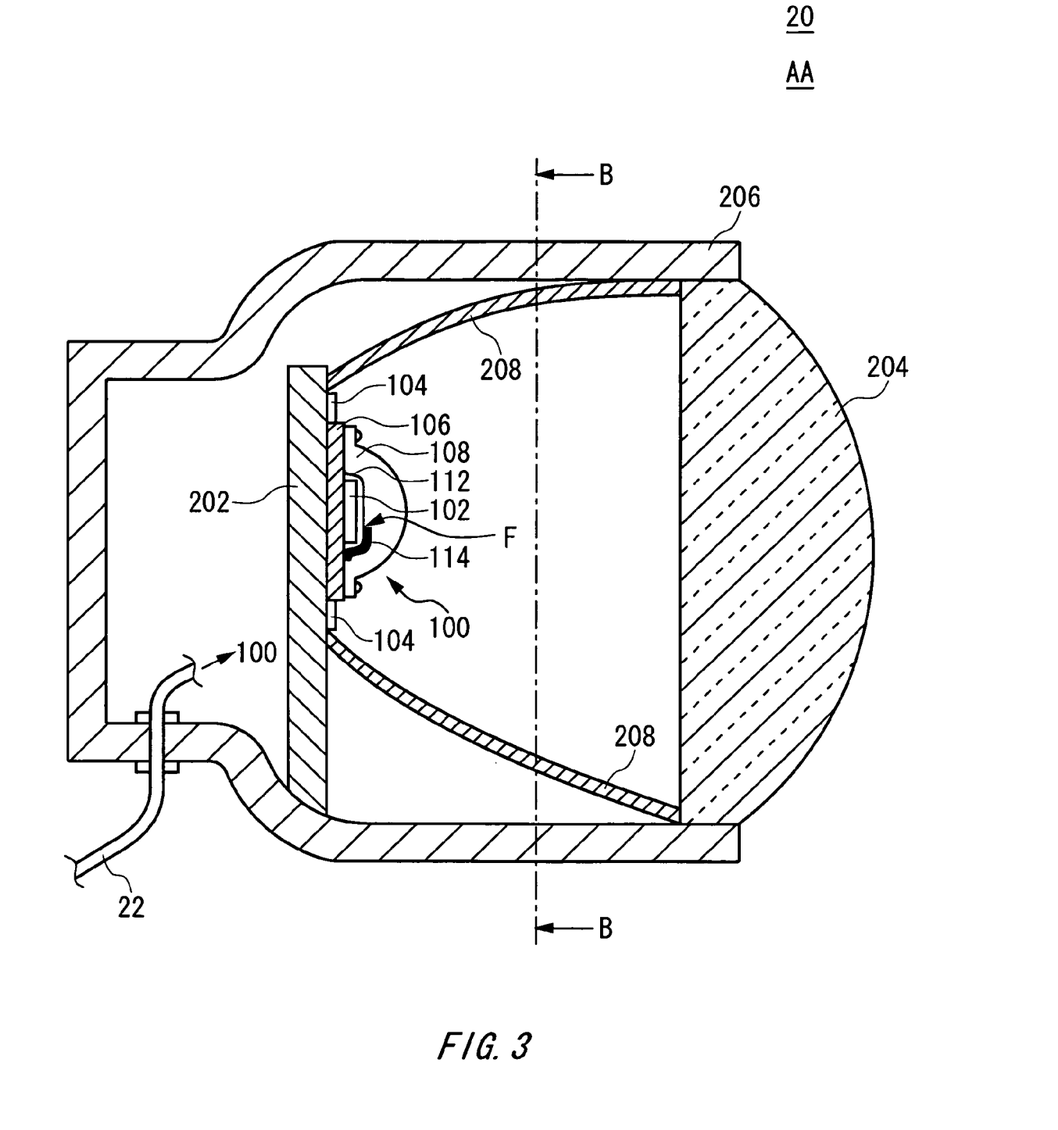
FIG. 3 is a cross-sectional view of an exemplary light source unit in the vehicular lamp of the present invention, taken along line A—A.
Figure 4:
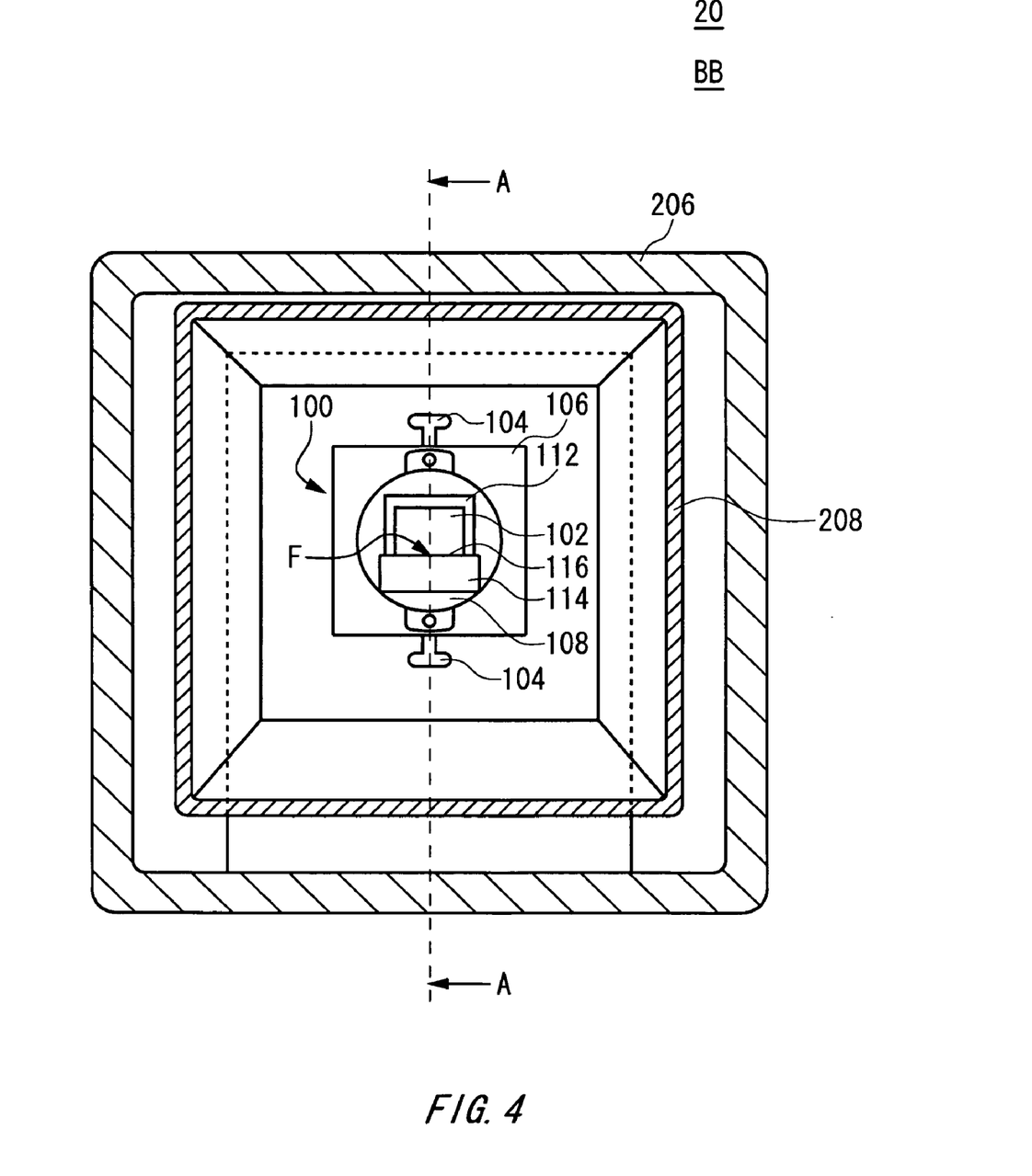
FIG. 4 is a cross-sectional view of the exemplary light source unit in the vehicular lamp of the present invention, taken along line B–BA.

FIGS. 3 and 4 show an exemplary structure of the light source unit 20. FIG. 3 shows an A-A cross-section of the light source unit 20, while FIG. 4 shows a B-B cross-section thereof. The light source unit 20 includes the light source module 100, a lens 204, a securing member 202, an extension 208 and a housing 206.

The light source module 100 is an LED module for generating white light, for example, and generates light in accordance with a power received from the outside of the light source unit 20 via the cable 22. The lens 204 is an exemplary optical member used in the vehicular lamp 10 (see FIG. 1) and directs the light generated by the light source module 100 forward of the automobile.

The securing member 202 is a plate-like member and is secured to the housing 206 in such a manner that one surface faces forward of the automobile, for example. The securing member 202 supports and secures the bottom surface of the light source module 100 on that one surface. Thus, the securing member 202 allows the light source module 100 to generate light forward of the automobile. Moreover, the securing member 202 is formed from material having higher thermal conductivity than air, such as metal, and radiates heat generated by the light source module 100. In this example, since the securing member 202 is in contact with the housing 206 at its one end, the securing member 202 conducts the heat generated by the light source module 100, thereby cooling the light source module 100. In this manner, it is possible to prevent reduction in the amount of light generated by the light source module 100 because of the heat.

The extension 208 is formed by a thin metal plate, for example, to extend from a position near the light source module 100 to a position near an edge of the lens 204. Thus, the extension 208 hides a gap between the inner face of the housing 206 and the light source module 100, thereby improving the appearance of the vehicular lamp 10. The extension 208 may reflect light generated by the light source module 100.

The housing 206 is a case for accommodating the light source module 100, the securing member 202 and the extension 208. The housing 206 has an opening on its front surface and holds the lens 204 in this opening. The housing 206 may further conduct heat received from the light source module 100 via the securing member 202, to the heat-radiation member 24 (see FIG. 1) and/or the extension reflector 28 (see FIG. 1). In this manner, it is possible to cool the light source module 100 appropriately.

Next, the light source module 100 is described in further detail. The light source module 100 includes a plurality of electrodes 104, a substrate 106, a semiconductor light-emitting element or device 102, a fluorescent member 112, a light-blocking member 114 and a sealing member 108. The electrodes 104 are electrically connected to the semiconductor light-emitting element 102 and supply a power supplied from the outside of the light source unit 20 via the cable 22, to the semiconductor light-emitting element 102.

The substrate 106 is a plate-like member secured on the surface of the securing member 202 and holds the semiconductor light-emitting element 102 and the fluorescent member 112 in such a manner they are opposed to the lens 204. At least a part of the substrate 106 is formed from material having higher thermal conductivity than air, such as metal, and conducts heat generated by the semiconductor light-emitting element 102 to the securing member 202.

The semiconductor light-emitting element 102 is a light-emitting diode and is arranged to be opposed to the securing member 202 with the substrate 106 sandwiched therebetween. The semiconductor light-emitting element 102 generates light from its surface opposed to the lens 204 in accordance with the power received from the outside of the light source unit 20. In this example, the semiconductor light-emitting element 102 generates blue light. Moreover, the semiconductor light-emitting element 102 may also generate light from its end face. The surface of the semiconductor light-emitting element 102 has a substantially square shape having a side of 1 mm, for example.

The fluorescent member 112 is formed to cover the surface of the semiconductor light-emitting element 102. The fluorescent member 112 generates yellow light that is a complementary color of blue light in accordance with the blue light generated by the semiconductor light-emitting element. In this case, the light source module 100 generates white light based on the blue light and the yellow light that are generated by the semiconductor light-emitting element 102 and the fluorescent member 112, respectively. In an alternative example, the semiconductor light-emitting element 102 may generate ultraviolet light to the fluorescent member 112. In this case, the fluorescent member 112 may generate white light in accordance with that ultraviolet light.

The light-blocking member 114 is formed to be opposed to the semiconductor light-emitting element 102 with the fluorescent member 112 sandwiched therebetween and to cover a side of the semiconductor light-emitting element 102 and a part of the florescent member 112. Moreover, the light-blocking member 114 is provided to overlap the fluorescent member 112. Thus, the light-blocking member 114 blocks a part of the light generated by the semiconductor light-emitting element 102 and that generated by the fluorescent member 112. In this example, the light-blocking member 114 has a side 116 for forming a bright region and a dark region, that is substantially parallel to the side of the semiconductor light-emitting element 102. The side 116 is opposed to the surface of the semiconductor light-emitting element 102 with the fluorescent member 112 arranged therebetween. Thus, the light-blocking member 114 forms a clear boundary between the bright region and the dark region based on the shape of the side 116 in accordance with the light generated by the semiconductor light-emitting element 102 and that generated by the fluorescent member 112.

The light-blocking member 114 is formed of black resin or the like. The light-blocking member 114 may be formed by applying black coating medium or the like onto the light-blocking member 114. Alternatively, the light-blocking member 114 may be provided away from the fluorescent member 112 to be in the sealing member 108 or the surface of the sealing member 108.

The sealing member 108 seals the fluorescent member 112 and the light-blocking member 114. The sealing member 108 is formed from material that can transmit light generated by the semiconductor light-emitting element 102 and light generated by the fluorescent member 112, such as transparent resin, to be hemispherical, for example. The sealing member 108 may be formed from material having larger refractive index than air to cover the light-generating surface of the fluorescent member 112. In this case, the light generated by the semiconductor light-emitting element 102 and fluorescent member 112 can be efficiently taken out and used.

The securing member 202 secures the light-source module 100 so as to make substantially the center of the side 116 coincident with a focus F of the lens 204. The side 116 extends in a focal plane of the lens 204 substantially from side to side of the automobile. Thus, in this example, the lens 204 clearly projects the shape of the side 116 forward of the automobile. The lens 204 may form at least a part of a cut line that defines the boundary between the bright region and the dark region in the light distribution pattern of the light source unit 20, based on the boundary formed by the side 116. In this case, the light source unit 20 can clearly form the cut line.

The fluorescent member 112 generate light from its portion covering the end face of the semiconductor light-emitting element 102 in accordance with light generated by that end face, for example. Thus, if the cut line is formed by projecting the shape of the semiconductor light-emitting element 102 without using the light-blocking member 114, for example, the boundary between the bright region and the dark region may blur in the cut line because of an effect of the light generated from the end face of the semiconductor light-emitting element 102 and the light generated from the fluorescent member 112 covering that end face. However, according to this example, the cut line in the light distribution pattern of the light source unit 20 can be clearly formed by using the light-blocking member 114.

Moreover, since the light-blocking member 114 is arranged to overlap the fluorescent member 112, it is possible to easily form the light-blocking member 114 at an appropriate position with respect to the semiconductor light-emitting element 102. Therefore, extra light generated from the semiconductor light-emitting element 102 and fluorescent member 112 can be appropriately blocked, thus clearly forming the boundary between the bright and dark regions based on the side 116.

Figure 5:
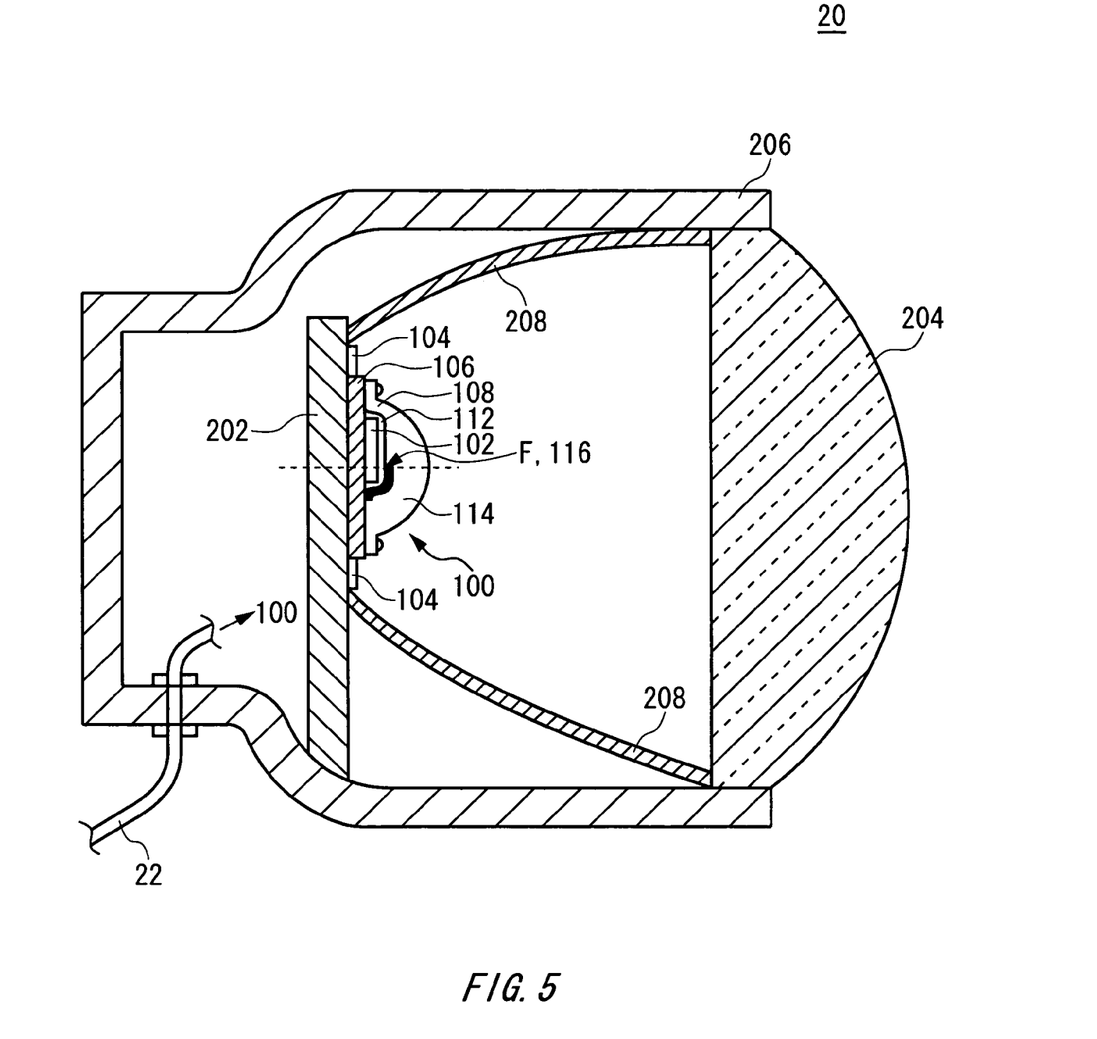
FIG. 5 shows another exemplary light source unit according to the present invention.

FIG. 5 shows another exemplary light source unit 20. Except for points described below, the components in FIG. 5 that are labeled with the same reference numerals as those in FIG. 3 and/or FIG. 4 have functions the same as or similar to those in FIG. 3 and/or FIG. 4. Therefore, the description of such components is omitted.

In this example, the hemispherical sealing member 108 seals the semiconductor light-emitting element 102, the fluorescent member 112 and the light-blocking member 114, while the center of the side 116 is arranged to be substantially coincident with the center of the sphere. In this case, the light source module 100 emits light generated by the semiconductor light-emitting element 102 and fluorescent member 112 from a portion near the center of the side 116 with high precision. Moreover, since the lens 204 has a focus F at the center of the side 116, it can project the boundary between the bright and dark regions that is formed by the side 116. Thus, according to this example, the cut line can be formed further clearly.

Figure 6:
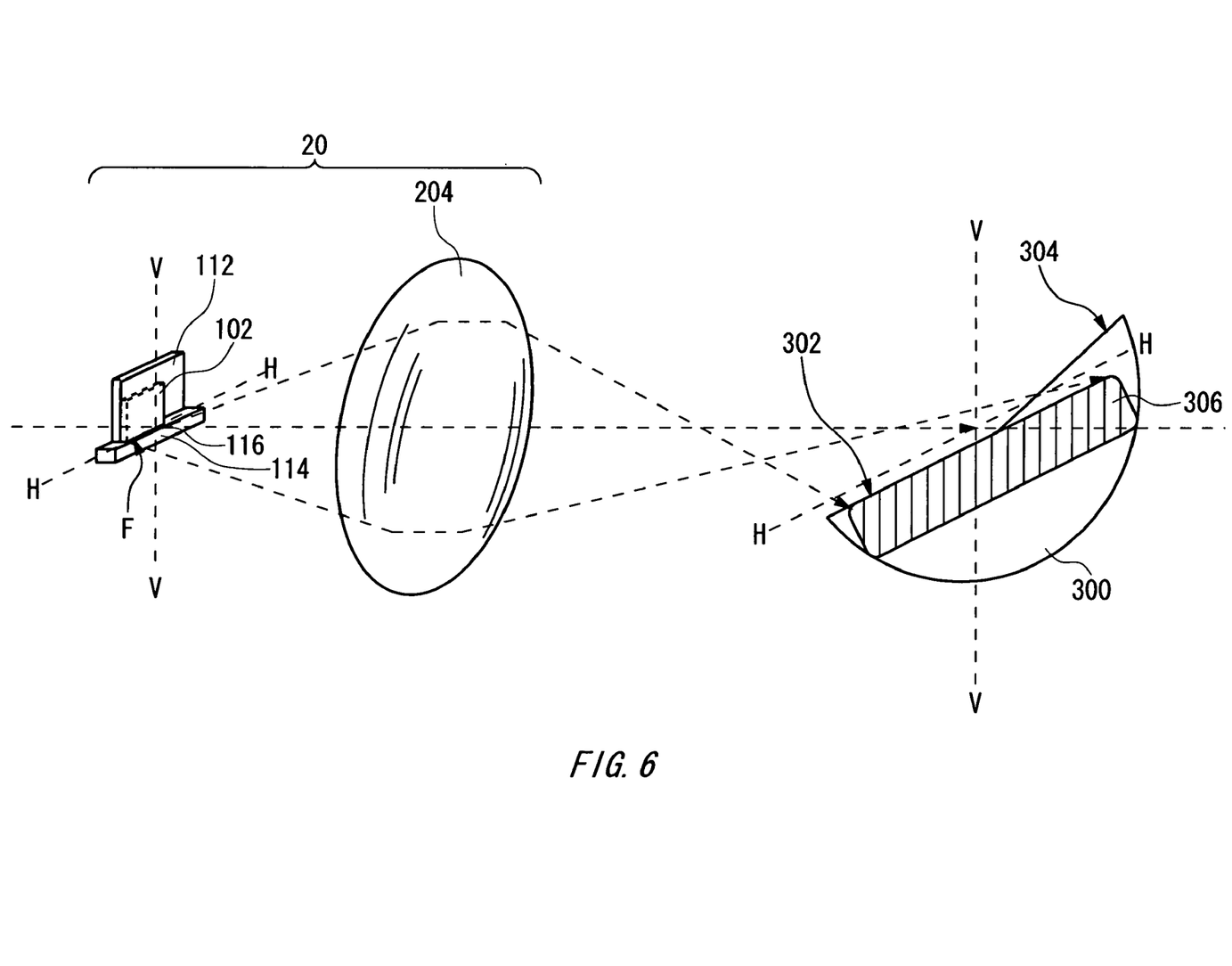
FIG. 6 shows an exemplary light source pattern according to the present invention.

FIG. 6 shows an exemplary light distribution pattern 300 formed by the vehicular lamp 10 (see FIG. 1). The light distribution pattern 300 is a distribution pattern of a low beam, that is formed on a virtual vertical screen arranged ahead of the vehicular lamp 100 with a distance of 25 meters therebetween. In this example, the vehicular lamp 100 forms the light distribution pattern 300 having a horizontal cut line 302 that defines a boundary between bright and dark regions substantially in the horizontal direction and a diagonal cut line 304 for defining a boundary between bright and dark regions in a predetermined direction at an angle of about 15° with the horizontal direction.

In this example, the vehicular lamp 10 includes a plurality of light source units 20 having different light distribution characteristics and forms the light distribution pattern 300 based on light generated by the respective light source units 20. In this case, each light source unit 20 forms a part of the light distribution pattern 300. For example, the light source unit 20 described in conjunction with FIGS. 3 and 4 forms a region 306 that is a part of the light distribution pattern 300.

The light distribution characteristics of the light source unit 20 described in conjunction with FIGS. 3 and 4 are described in further detail. In this example, the lens 204 in this light source unit 20 directs light generated by the light source module 100 forward, thereby forming the region 306. Moreover, the lens 204 emits the light generated by the light source module 100 such that the emitted light intersects the optical axis of the light source unit 20 in the frontward direction of the lens 204. Thus, the lens 204 projects the side 116 as the upper side of the region 306. Furthermore, the lens 204 projects light generated by portions of the semiconductor light-emitting element 102 and fluorescent member 112 that are not blocked by the light-blocking member 114, to a region below the upper side of the region 306 that corresponds to the side 116.

The lens 204 forms at least a part of the upper side of the region 306 that corresponds to the side 116 at a position at which at least a part of the horizontal cut line 302 is to be formed. Thus, the light source unit 20 forms at least a part of the horizontal cut line 302 based on the boundary between bright and dark regions that is formed by the region 306. In this case, since the focus F of the lens 204 exists on the side 114, the lens 204 forms at least a part of the cut line by projecting the shape of the side 116 ahead of the automobile. Therefore, according to this example, the vehicular lamp 10 can clearly form the horizontal cut line 302 based on the shape of the side 116.

Please note that the side 116 is formed to correspond to the horizontal cut line 302 and extends substantially along a left-right direction of the automobile, i.e., from side to side in the automobile. In an alternative example, the side 116 may be formed to correspond to the diagonal cut line 304, for example. In this case, the side 116 may extend in a predetermined direction that makes an angle with the horizontal direction, for example. In this case, the light source unit 20 can clearly form the diagonal cut line 304. Moreover, the side 116 may be formed to correspond to both the horizontal cut line 302 and the diagonal cut line 304, to have a shape with both ends turned down.

Figure 7:
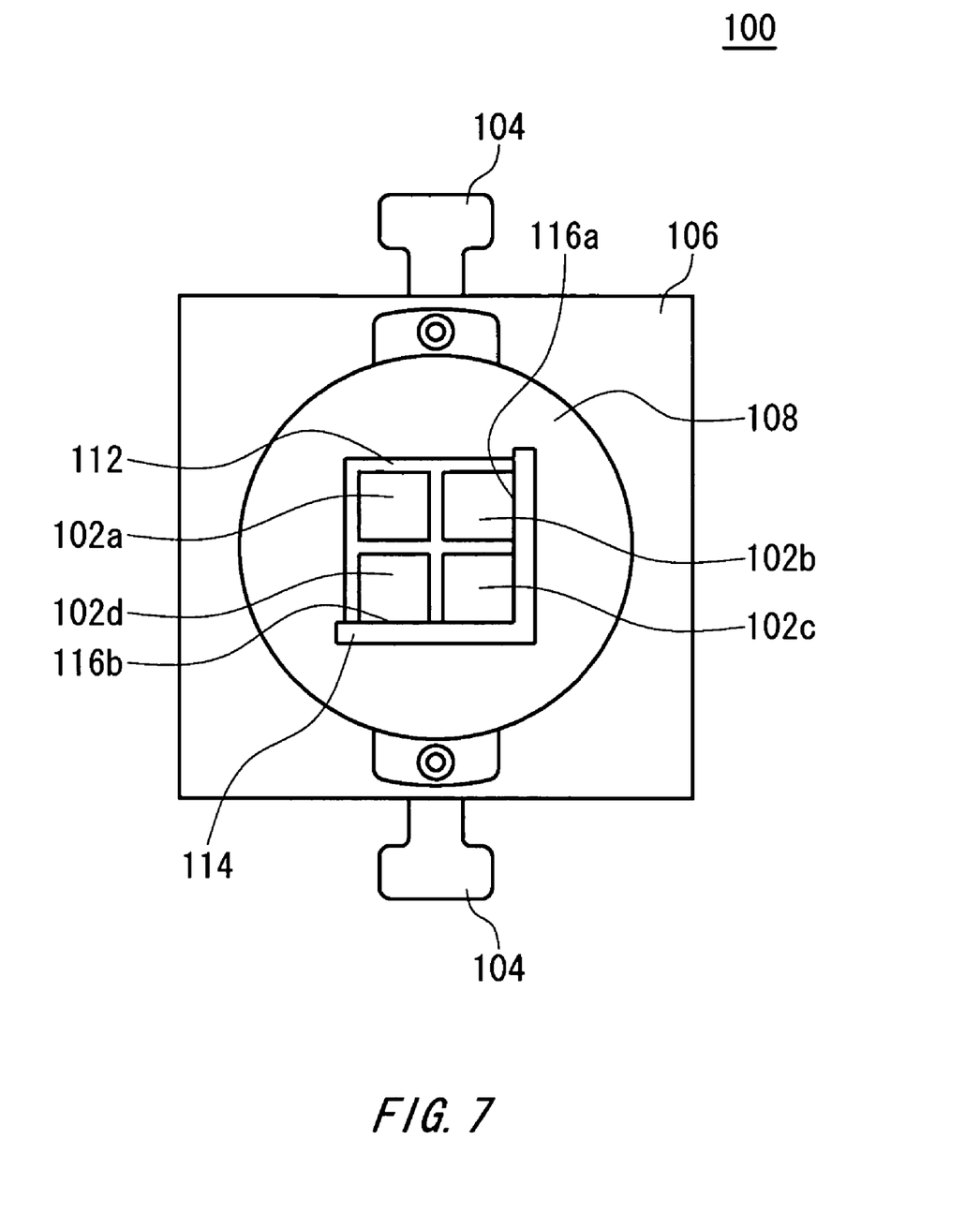
FIG. 7 shows another exemplary structure of a light source module according to the present invention.

FIG. 7 shows another exemplary structure of the light source module 100. In this example, the light source module 100 includes a plurality of semiconductor light-emitting elements 102a–102d. Thus, the light source module 100 can generate a larger amount of light, as compared with a case where a single semiconductor light-emitting element 102 is provided. It is preferable that a distance between adjacent two of the semiconductor light-emitting elements 102a–102d be made narrow in order to make an image projected by the lens 204, that corresponds to the light source module 100, substantially uniform in the light amount. The fluorescent member 112 is formed to cover the semiconductor light-emitting elements 102a–102d and gaps between those semiconductor light-emitting elements 102a–102d.

In this example, the light-blocking member 114 is shaped to be substantially L-shaped, and is provided commonly to the semiconductor light-emitting elements 102b–102d other than the semiconductor light-emitting element 102a. The light-blocking member 114 has a plurality of sides 116a and 116b for forming bright and dark regions. The side 116a is opposed to the semiconductor light-emitting elements 102b and 102c with the fluorescent member 112 sandwiched therebetween. The side 116b is opposed to the semiconductor light-emitting elements 102c and 102d with the fluorescent member 112 sandwiched therebetween. Thus, the light-blocking member 114 covers one side of each of the semiconductor light-emitting elements 102b and 102d and two sides of the semiconductor light-emitting element 102c. In this case, the light-blocking member 114 may entirely cover the two sides of the semiconductor light-emitting elements 102c, that are adjacent to each other. Thus, the light-blocking member 114 forms a clear boundary between bright and dark regions in accordance with light generated by the semiconductor light-emitting elements 102a–102d and light generated by the fluorescent member 112 based on the shapes of the sides 116a and 116b.

In this example, the lens 204 (see FIG. 3) has a focus F on either of the sides 116a and 116b. In this case, the light source unit 20 can also form the clear cut line by projecting the shape of that side 116. Thus, in this example, it is also possible to form the light distribution pattern appropriately.

In this example, the light-blocking member 114 forms the boundary between bright and dark regions that extends substantially parallel to a direction connecting a plurality of electrodes 104, based on the shape of the side 116a. The light-blocking member 114 also forms the boundary between bright and dark regions that extends substantially vertical to the direction connecting the electrodes 104, based on the shape of the side 116b. In this case, the securing member 202 (see FIG. 3) may hold the light source module 100 in such a manner that either of the sides 116a and 116b is arranged substantially horizontally. Thus, according to this example, the light source module 100 can be mounted with high freedom. In addition, this improves the freedom in design of other components in the light source unit 20 (see FIG. 3), wirings on the substrate and the like.

Moreover, in this example, the light-blocking member 114 covers one side of each of the semiconductor light-emitting elements 102b and 102d and two sides of the semiconductor light-emitting element 102c. Alternatively, the light-blocking member 114 may cover one side of each of the semiconductor light-emitting elements 102a and 102c and two sides of the semiconductor light-emitting element 102*d*. Alternatively, the light-blocking member 114 may cover two sides of each of the semiconductor light-emitting elements 102*a*–102*d*.

Figure 8:
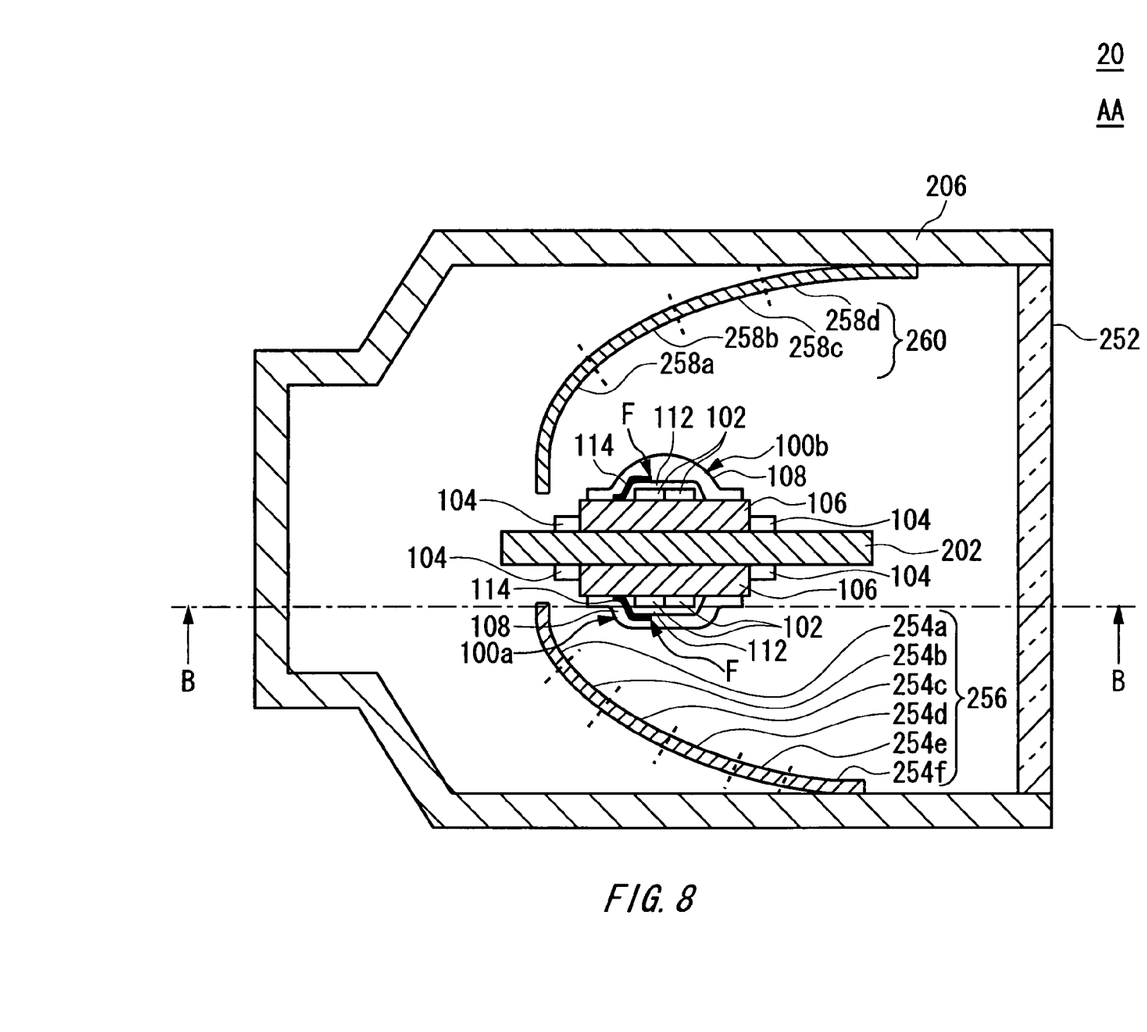
FIG. 8 is across-sectional view of another exemplary light source unit in the vehicular lamp of the present invention, taken along line A—A.
Figure 9:
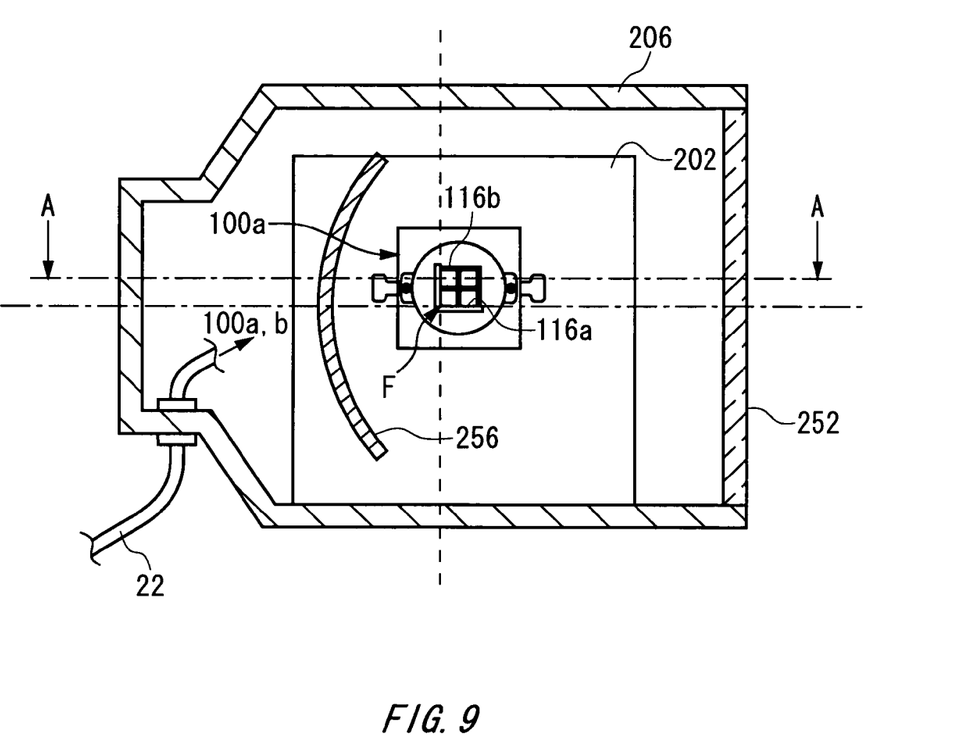
FIG. 9 is a cross-sectional view of the other exemplary light source unit, taken along line B–BA.

FIGS. 8 and 9 show another exemplary structure of the light source unit 20. FIGS. 8 and 9 show an A—A cross-section and a B–B cross-section of that structure, respectively. Except for points described below, the components in FIGS. 8 and 9 that are labeled with the same reference numerals as those in FIG. 3 and/or FIG. 4 have functions the same as or similar to those in FIG. 3 and/or FIG. 4. Therefore, the description of such component is omitted. Please note that FIG. 8 shows the substantially horizontal cross-section in a case where the light source unit 20 is mounted on an automobile or the like.

In this example, the light source unit 20 includes a cover 252, a plurality of reflectors 256 and 260, a plurality of light source modules 100*a* and 100*b* and a securing member 202. The cover 252 is provided on the front surface of the light source unit 20 and is formed to be transparent, for example, from material that can transmit light generated by the semiconductor light-emitting element 102.

The reflectors 256 and 260 is provided to correspond to the light source modules 100*a* and 10*b*, respectively, in such a manner that each reflector covers the associated one of the light source modules 100*a* and 100*b* from behind. Thus, each reflector 256, 260 reflects light generated by the associated light source module 100 ahead of the automobile. The reflector 256 is formed by using an optical center F as a reference point in its design. The reflector 260 is formed by using an optical center F' as a reference point in its design. Please note that each of the reflectors 256 and 260 is exemplary optical members used in the vehicular lamp 10 (see FIG. 1) and forms at least a part of the light distribution pattern of the vehicular lamp 10 by directing the light generated by the associated light source module 100 ahead of the automobile.

The light source modules 100*a* and 100*b* are secured to the securing member 202 while their bottom surfaces are opposed to each other with the securing member 202 sandwiched therebetween. The light source modules 100*a* and 100*b* are secured to the front surface and the rear surface of the securing member 202, respectively, in such a manner that the front and rear surfaces of the light source modules 100*a* and 100*b* are arranged in the substantially right-left direction of the automobile, i.e., along the direction extending from side to side in the automobile.

The light source module 100*a* is provided in such a manner that one end of the side 116*a* is coincident with the optical center F and the side 116*a* extends substantially horizontally from the optical center F toward the cover 252. Thus, the reflector 256 clearly projects the shape of the side 116*a* ahead of the automobile. Moreover, each of the semiconductor light-emitting elements 102*a*–102*d* in the light source module 100*a* is arranged at a position closer to the cover 252 than the optical center F.

The light source module 100*b* is provided in such a manner that one end of the side 116*a* is coincident with the optical center F' and the side 116*a* extends substantially horizontally from the optical center F' of the reflector 260 toward the cover 252. Thus, the reflector 260 clearly projects the shape of the side 116*a* ahead of the automobile.

In this example, the reflector 256 includes a plurality of light distribution steps 254*a*–254*f*. The reflector 256 forms at least a part of a diagonal cut line in the light distribution pattern of the vehicular lamp 10 based on light reflected by the light distribution steps 254*a*–254*f*.

Each of the light distribution steps 254*a*–254*g* is a divided section of the reflector 256, that is a rectangular shape or a trapezoidal shape that is inclined. The light distribution steps 254*a*–254*f* are formed by hyperbolic paraboloids that are set in accordance with the shape of the diagonal cut line to be formed at respective positions in a predetermined paraboloid of revolution. The "hyperbolic paraboloid" mentioned above means a plane having a substantially vertical cross-section formed by a parabola that broadens forward of the light source unit 20 and a substantially horizontal cross-section formed by a parabola that broadens backward of the light source unit 20, or a plane approximating that plane.

The reflector 260 includes a plurality of light distribution steps 258*a*–258*d* and forms at least a part of a horizontal cut line in the light distribution pattern of the vehicular lamp 10 based on light reflected by the respective light distribution steps 258*a*–258*d*. The light distribution steps 258*a*–258*d* may have structures that are the same as or similar to those of the light distribution steps 254*a*–254*f*.

Figure 10:
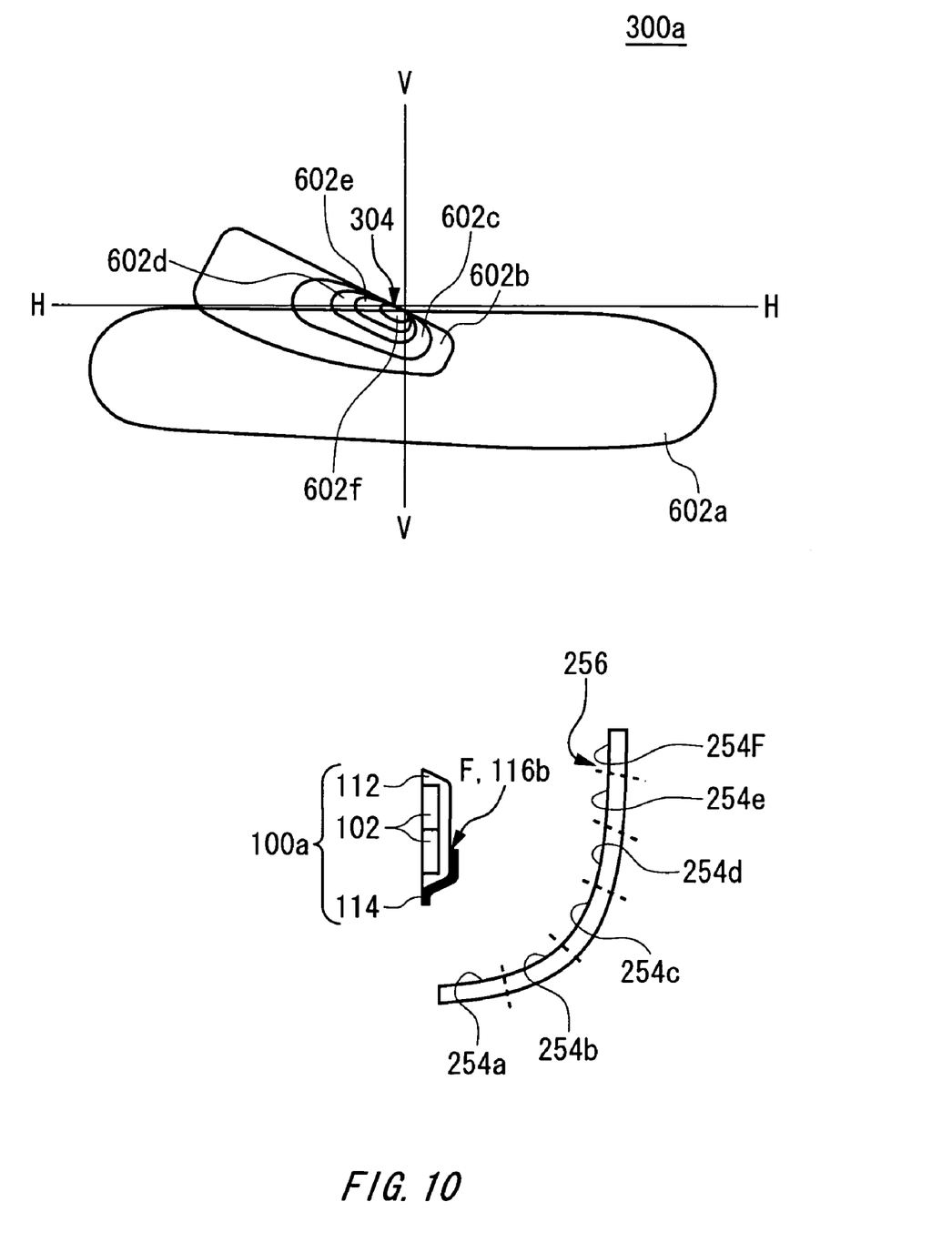
FIG. 10 shows an exemplary light source pattern according to the present invention.

FIG. 10 shows an exemplary light distribution pattern 300*a* formed by the reflector 256, together with the reflector 256 and the light source module 100*a*. In this example, the reflector 256 forms the light distribution pattern 300*a* including a plurality of regions 602*a*–602*f*. Each of the light distribution steps 254*a*–254*f* reflects light generated by the light source module 100*a*, thereby forming a corresponding one of the regions 602*a*–602*f*.

In this example, the light distribution step 254*a* forms the region 602*a* that spreads substantially horizontally. In this case, the light distribution step 254*a* projects the side 116*a* (see FIG. 9) as the upper side of the region 602*a*. Moreover, the light distribution steps 254*b*–254*f* form the regions 602*b*–602*f* that spread in a predetermined oblique direction in this example. In this case, the light distribution steps 254*b*–254*f* project the side 116*a* as at least a part of the diagonal cut line 304. Thus, the reflector 256 forms at least a part of the diagonal cut line 304 based on the boundaries between bright and dark regions of the regions 602*b*–602*f*.

The light source module 10*a* is secured in such a manner that one end of the side 116*a* is coincident with the optical center F. Moreover, the light distribution steps 254*a*–254*f* are formed by using the optical center F as a common reference point in their design. Thus, the reflector 256 can clearly project the shape of the side 116*a*. Therefore, according to this example, the vehicular lamp 10 can form the diagonal cut line 304 with high precision based on the shape of the side 116*a*.

Figure 11:
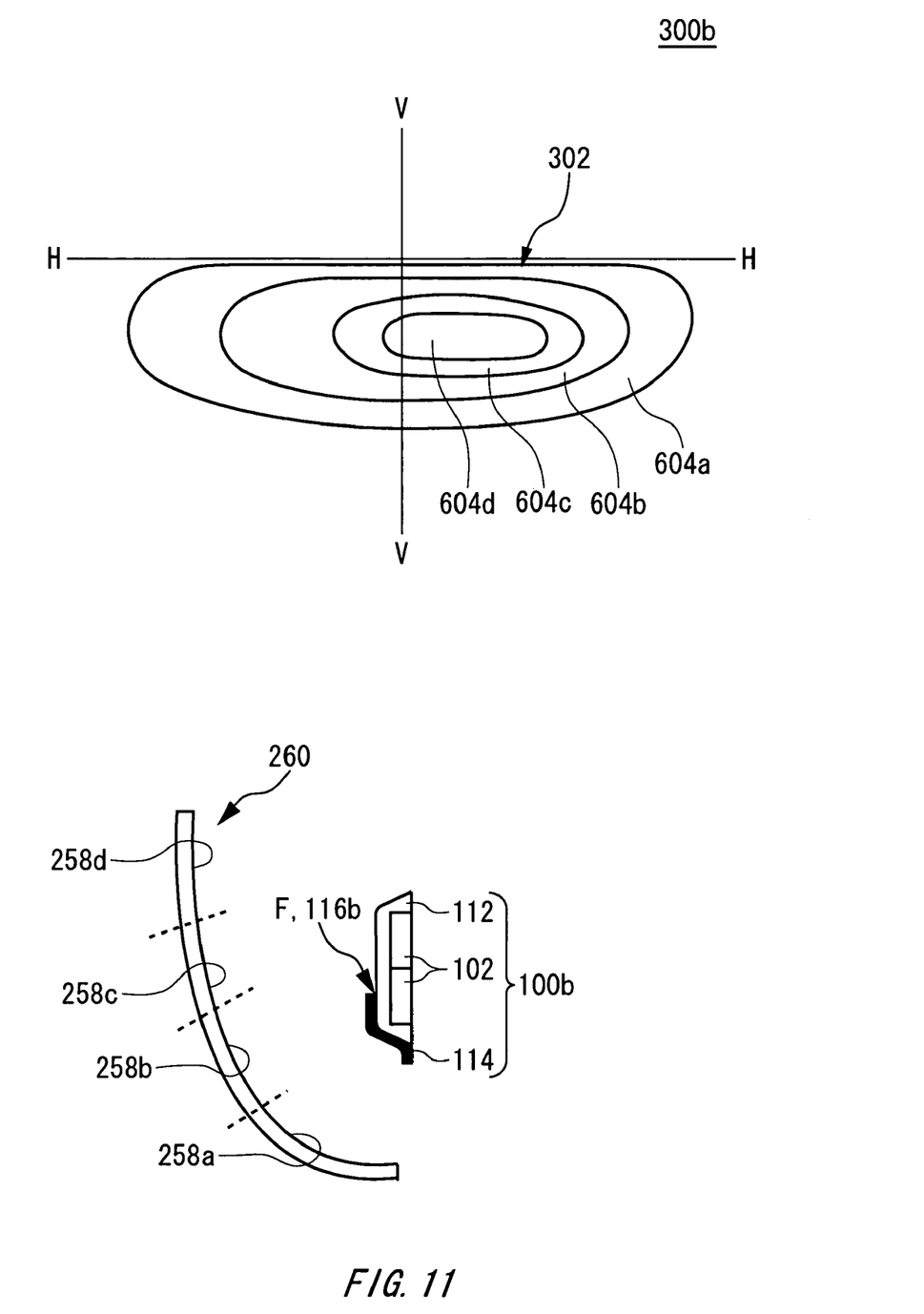
FIG. 11 shows an exemplary light source pattern according to the present invention.

FIG. 11 shows light distribution patterns 300*b* formed by the reflector 260, together with the reflector 260 and the light source module 10*b*. In this example the reflector 260 forms a plurality of light distribution patterns 300*b* including a plurality of regions 604*a*–604*d*. Each of the light distribution steps 258*a*–258*d* reflects light generated by the light source module 100*b*, thereby forming a corresponding one of the regions 604*a*–604*d* that spread in the substantially horizontal direction. The reflector 260 forms at least a part of the horizontal cut line 302 based on the boundaries of bright and dark regions of the regions 604*a*–604*d*.

In this example, the light distribution steps 258*a*–258*d* forms the regions 604*a*–604*d* that spread in the substantially horizontal direction. In this case, the light distribution steps 258*a*–258*d* project the side 116*a* (see FIG. 9) as upper sides of the regions 604*a*–604*d*, respectively. Thus, the reflector 260 forms at least a part of the horizontal cut line 302 based on the boundaries between bright and dark regions of the regions 604*a*–604*d*.

The light source module 100b is secured in such a manner that one end of the side 116b is coincident with the optical center F'. Moreover, the light distribution steps 258a–258d are formed by using the optical center F' as a common reference point in their design. Thus, the reflector 260 can clearly project the side 116a. Therefore, according to this example, the horizontal cut line 302 can be formed with high precision based on the light generated by the light source module 10b.

As is apparent from the above description, according to the present invention, a light distribution pattern of a vehicular lamp can be appropriately formed.

The vehicular lamp to which the present invention may be applied includes headlamps such as a regular headlamp, fog lamp or cornering lamp for automobiles, motorcycles or trains.

Although the present invention has been described by way of exemplary embodiments, it should be understood that those skilled in the art might make many changes and substitutions without departing from the spirit and the scope of the present invention which is defined only by the appended claims.

What is claimed is:

1. A vehicular lamp used in an automobile, comprising:
   a light source module operable to generate light; and
   an optical member operable to direct the light generated by said light source module forward, wherein said light source module includes:
   a semiconductor light-emitting element operable to generate light;
   a fluorescent member, covering a surface of said semiconductor light-emitting element, operable to emit light in accordance with said light generated by said semiconductor light-emitting element; and
   a light-blocking member, formed to be opposed to said semiconductor light-emitting element with said fluorescent member sandwiched therebetween and cover a side of said semi-conductor light-emitting element and a part of said fluorescent member, operable to block a part of said light generated by said semiconductor light-emitting element and a part of said light emitted by said fluorescent member.

2. The vehicular lamp as claimed in claim 1, wherein said optical member forms at least a part of a cut line that defines a boundary between a bright region and a dark region in a light distribution pattern of said vehicular lamp by projecting at least a part of a shape of an edge of said light-blocking member.

3. The vehicular lamp as claimed in claim 1, wherein said light-blocking member is formed to overlap said fluorescent member.

4. The vehicular lamp as claimed in claim 1, wherein said light source module includes a plurality of semiconductor light-emitting elements, and
   said light-blocking member is provided commonly to said plurality of semiconductor light-emitting elements in such a manner that said light-blocking member covers a side of each of said plurality of semiconductor light-emitting elements.

5. The vehicular lamp as claimed in claim 1, wherein said light-blocking member is formed to entirely cover two sides of said semiconductor light-emitting element, the two sides being adjacent to each other.

* * * * *